(12) United States Patent
Jasper et al.

(10) Patent No.: US 9,806,670 B2
(45) Date of Patent: Oct. 31, 2017

(54) ELASTIC SHADING TEXTILE COMPRISING PHOTOVOLTAIC ELEMENTS, AND CORRESPONDING MULTIPLE GLAZING

(71) Applicant: PENN TEXTILE SOLUTIONS GMBH, Paderborn (DE)

(72) Inventors: Leo Jasper, Heerlen (NL); Franz Schuette, Paderborn (DE)

(73) Assignee: Penn Textile Solutions GmbH (DE)

( * ) Notice: Subject to any disclaimer, the term of this patent is extended or adjusted under 35 U.S.C. 154(b) by 0 days.

(21) Appl. No.: 14/809,735

(22) Filed: Jul. 27, 2015

(65) Prior Publication Data

US 2015/0333691 A1   Nov. 19, 2015

Related U.S. Application Data

(63) Continuation of application No. PCT/DE2013/000422, filed on Jul. 31, 2013.

(30) Foreign Application Priority Data

Feb. 11, 2013  (DE) .................. 10 2013 101 310

(51) Int. Cl.
```
H02S 30/20      (2014.01)
E06B 9/24       (2006.01)
E06B 9/264      (2006.01)
H01L 31/0392    (2006.01)
```
(52) U.S. Cl.
CPC ............... H02S 30/20 (2014.12); E06B 9/24 (2013.01); E06B 9/264 (2013.01); H01L 31/03926 (2013.01); E06B 2009/2429 (2013.01); E06B 2009/2476 (2013.01); E06B 2009/2643 (2013.01); Y02E 10/50 (2013.01)

(58) Field of Classification Search
CPC ............................................... E06B 2009/2476
See application file for complete search history.

(56) References Cited

U.S. PATENT DOCUMENTS

| | | | |
|---|---|---|---|
| 2003/0211797 A1* | 11/2003 | Hill ...................... | D03D 1/0088 442/205 |
| 2011/0048656 A1* | 3/2011 | Chu ........................ | E06B 9/28 160/310 |
| 2012/0152469 A1 | 6/2012 | Choi et al. | |

FOREIGN PATENT DOCUMENTS

| | | | | |
|---|---|---|---|---|
| DE | 19752162 A1 | 6/1999 | | |
| DE | 202004014182 U1 | 1/2005 | | |
| DE | 102010022059 A1 * | 12/2011 | ............... | A01G 9/22 |

(Continued)

OTHER PUBLICATIONS

English Translation of DE 102010022059 A1.*

(Continued)

*Primary Examiner* — Keith Hendricks
*Assistant Examiner* — Daniel Malley, Jr.
(74) *Attorney, Agent, or Firm* — Harness, Dickey & Pierce, P.L.C.

(57) ABSTRACT

A shading textile is characterized in that it comprises a plurality of strip-shaped photovoltaic lamellas which, aligned next to one another or spaced apart from one another in their longitudinal direction, form a continuous product by means of a yarn system, wherein the yarn system is designed to be elastic in at least one direction, so that by tensioning the shading textile, a spacing between adjacent photovoltaic elements can be varied perpendicular to the longitudinal direction.

8 Claims, 6 Drawing Sheets

(56) References Cited

FOREIGN PATENT DOCUMENTS

DE      102010022059 A1    12/2011
WO     WO-00/55465 A1     9/2000
WO      WO 0055465 A1 *  9/2000  ............ E06B 9/264
WO    WO-2010133279 A1   11/2010

OTHER PUBLICATIONS

International Preliminary Report on Patentability, in German with English translation, (Chapter II of the Patent Cooperation Treaty) for PCT/DE2013/000422, dated May 27, 2015; IPEA/EP.

* cited by examiner

ELASTIC SHADING TEXTILE COMPRISING PHOTOVOLTAIC ELEMENTS, AND CORRESPONDING MULTIPLE GLAZING

CROSS REFERENCE TO RELATED APPLICATIONS

This application is a continuation of PCT/DE2013/000422 filed Jul. 13, 2013 claiming priority to German patent application 10 2013 101 310.4 filed Feb. 11, 2013 both of which are hereby incorporated by reference in their entireties.

BACKGROUND OF THE INVENTION

Technical Field

The invention relates to an elastic shading textile with photovoltaic elements and a corresponding multiple glazing.

Discussion

A shading textile is known from DE 10 2010 022 059 A1 and is used not only for shading residences but also, for example, for shading greenhouses, in order to create optimal climatic conditions for plant cultivation.

In greenhouse shading in particular it is desirable to design the shading device in such a manner that, when it is used for shading a greenhouse, it contributes at least partially to covering the energy demand of the greenhouse. For this purpose, from DE 20 302 826 U1, lamellar blinds are known, which are arranged between the glass panes of a double glazing, wherein photovoltaic elements are arranged on the lamellas. However, such lamellar blinds have the disadvantage that no energy can be generated whenever the lamellas are arranged parallel to the direction of incidence of the sun rays in order to allow the entrance of sunlight into the greenhouse.

SUMMARY OF THE INVENTION

Therefore, an aspect of the invention is to further develop a shading textile and a corresponding multiple glazing in such a manner that they can also be used for generating electrical energy when no shading is to be provided.

The shading textile according to an embodiment of the invention is characterized in that it comprises a plurality of strip-shaped photovoltaic lamellas which, aligned next to one another or spaced apart from one another in their longitudinal direction, form a continuous product by means of a yarn system, wherein the yarn system is designed to be elastic in at least one direction, so that by tensioning the shading textile, a spacing between adjacent photovoltaic elements can be varied perpendicular to the longitudinal direction.

Thus, the shading textile according to an embodiment of the invention is characterized, in comparison to the shading textiles that are known from the prior art, precisely in that the photovoltaic elements, during the tensioning of the shading textile, do not change their orientation and are consequently always available for generating electrical energy independently of the operating position of the shading textile.

In a simplest embodiment of the invention, the photovoltaic elements are therefore arranged, in a relaxed position of the yarn system, aligned immediately next to one another, so that they produce substantially complete shading. By tensioning the yarn system, the photovoltaic elements are spaced apart from one another, so that light can fall through the gaps that form during the tensioning between the photovoltaic elements. Alternatively or additionally, the yarn system can also comprise openings that are closed when the shading textile is not tensioned and that open only when the shading textile is tensioned, in order to allow light to pass through.

In an embodiment of the invention, the yarn system can be stretched in the warp direction of the shading textile, wherein the photovoltaic lamellas extend in the weft direction, so that, just when the yarn system is tensioned in the warp direction, the photovoltaic lamellas are moved apart from one another in a direction perpendicular to the longitudinal direction of the photovoltaic lamellas.

In order to achieve electrical contacting of the photovoltaic lamellas, an embodiment of the invention provides that the yarn system comprises strands made of at least one thread, which extend in the warp direction spaced apart from one another, wherein at least one thread per strand is electrically conductive. Here, it is possible to provide that, on at least one of the photovoltaic lamellas, between respective adjacent strands, a photovoltaic element is arranged.

For the electrical contacting of the photovoltaic lamellas or of photovoltaic elements that are formed on the photovoltaic lamellas, it is provided, in another embodiment, that the photovoltaic lamellas comprise at least one film made from an electrically conductive material and extending in the weft direction, wherein at least one photovoltaic element on the photovoltaic lamella is in electrical contact with the film.

Alternatively to the last mentioned embodiment, another embodiment provides that the photovoltaic lamella comprises a textile web with at least one electrically conductive thread or yarn extending in the weft direction of the shading textile, wherein at least one photovoltaic element on the photovoltaic lamella is in electric contact with the electrically conductive thread or yarn.

According to an aspect of the invention, organic or inorganic solar films can be introduced as weft threads in the shading textile or the shading knitted fabric. In a particularly compact and easy to construct shading textile, the photovoltaic lamellas are elastically deformable photovoltaic films or they comprise such films. For this purpose, so-called CIGS polymer solar cells are suitable, for example.

In another embodiment, the photovoltaic lamellas each comprise a support lamella to which the photovoltaic film is attached, for example, glued. Here, the photovoltaic film can span the support lamella from a top side of the support lamella around facing longitudinal edges of the support lamella to an underside of the support lamella.

In an embodiment of the invention, the shading textile, in a tensioned state, has openings between the adjacent photovoltaic elements, which form only when the shading textile is tensioned, or which are covered up by the photovoltaic elements when the shading textile is not tensioned.

In order to guarantee that the openings are closed in the non-tensioned state of the shading textile, the yarn system can be tensioned elastically in the direction in which the shading textile is formed elastically, and it has a pretensioning in a direction opposite said direction, so that openings that should form when the shading textile is tensioned are closed when the shading textile is not tensioned.

According to an aspect of the invention, a multiple glazing is provided in which a shading textile of the above-described type is accommodated in an interstice between the panes.

Simple operation of the shading textile and at the same time a maintenance-free structure thereof can be achieved by linearly guiding the shading textile in the direction in which it is formed elastically, in the interstice between the panes, between a first and a second position, wherein, at a movable pulling end of the shading textile, which is arranged opposite a stationary fixed end of the shading textile, a first magnet is arranged, and, outside of the interstice between the panes, a second magnet is arranged, wherein the magnets are operatively connected.

A simplest possible operation of the shading textile can be achieved if the second magnet can be moved along a linear guide in the direction in which the shading textile is formed elastically.

BRIEF DESCRIPTION OF THE DRAWINGS

Embodiment examples are explained in reference to the following figures.

DETAILED DESCRIPTION OF THE PREFERRED EMBODIMENTS

Figure 1:
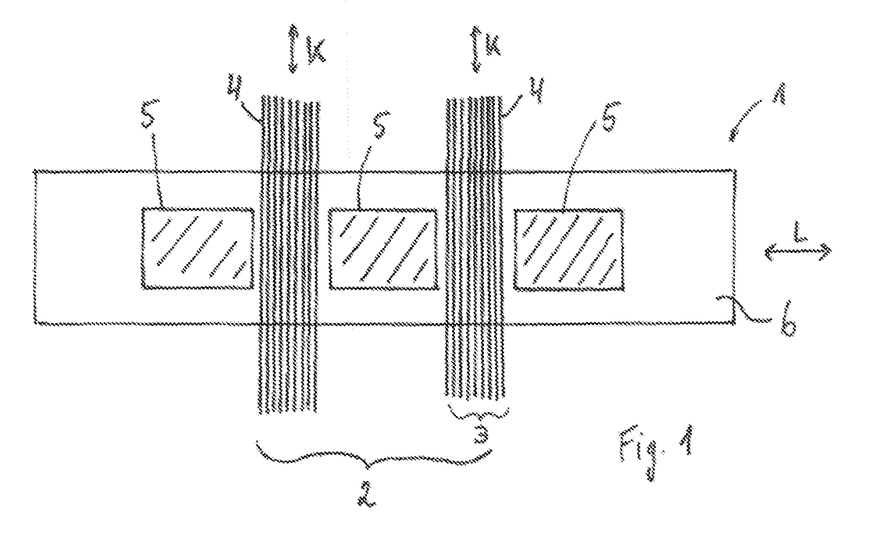
FIG. 1 shows a first embodiment of the shading textile according to the invention with a photovoltaic lamella comprising an electrically conductive film.

In the detail, shown in FIG. 1, of a shading textile according to the invention of a first embodiment, the yarn system 2 is formed from a plurality of strands 3 that are parallel and spaced apart, wherein each strand 3 in turn is constructed from a plurality of threads 4. Although, in the figures, the threads 4 are represented diagrammatically as running parallel, the yarn system 2 according to the invention should also comprise, in particular, strands made of woven or knitted threads 4. The strands 3 extend in the warp direction of the shading textile, while the photovoltaic lamellas 1 are introduced as weft threads in the yarn system 2, so that the longitudinal direction L of the photovoltaic lamellas 1 extend precisely in the weft direction, i.e., perpendicularly to the warp direction K of the yarn system 2. Between the strands 3 which are parallel and spaced apart, photovoltaic elements 5 are applied to the photovoltaic lamellas 1. The photovoltaic elements 5 can be photovoltaic films which are applied to a support lamella. In the embodiment according to FIG. 1, the photovoltaic elements 5 are applied to an aluminum film 6 in order to contact said film. In addition, the strands 3 comprise electrically conductive threads by means of which the photovoltaic elements 5 can be electrically contacted. By means of the electrically conductive films 6 of the photovoltaic lamellas 1 and by means of the stands 3 comprising electrically conductive threads, an active matrix is thus formed, by means of which each individual photovoltaic element 5 can be controlled or selected individually.

Figure 2:
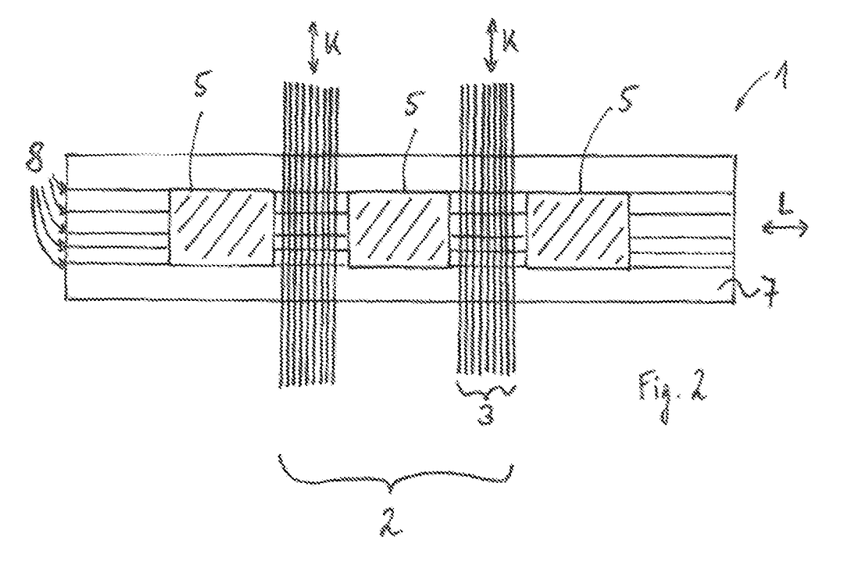
FIG. 2 shows a second embodiment of the shading textile according to the invention with a photovoltaic lamella comprising a conductive textile web.

The shading textile shown in FIG. 2 differs from the one shown in FIG. 1 in that the photovoltaic lamella 1 comprises, instead of an electrically conductive film, a textile web 7, which comprises at least one electrically conductive thread 8 extending in the weft direction K. The electrically conductive thread 8 extends over the entire length of the textile web 7, wherein all the photovoltaic elements 5 of a photovoltaic lamella 1 are contacted via the thread 8. Together with the strands 3, which again comprise at least one electrically conductive thread, the textile webs 7 of the photovoltaic lamella form an active matrix for the individual control of the photovoltaic elements 5.

Details of the shading textile according to the invention are shown in FIGS. 1 and 2. The finished product comprises, in the longitudinal direction L of the photovoltaic lamellas 1, a plurality of photovoltaic elements 5 as well as a plurality of strands 3 that are parallel and spaced apart. The number of the strands 3 as well as the length of the photovoltaic lamellas 1, and accordingly the number of the photovoltaic elements 5, is not limited to any particular number. In the same way, the respective product shown in the figures is extended in the warp direction K by the parallel alignment next to one another of a plurality of strip-shaped photovoltaic lamellas 1. Since the strands 3 are elastic in the warp direction K, it is possible to vary the spacing of adjacent photovoltaic lamellas 1 perpendicularly to the longitudinal direction of the photovoltaic lamellas 1 by tensioning the shading textile in the warp direction K.

Figure 3:
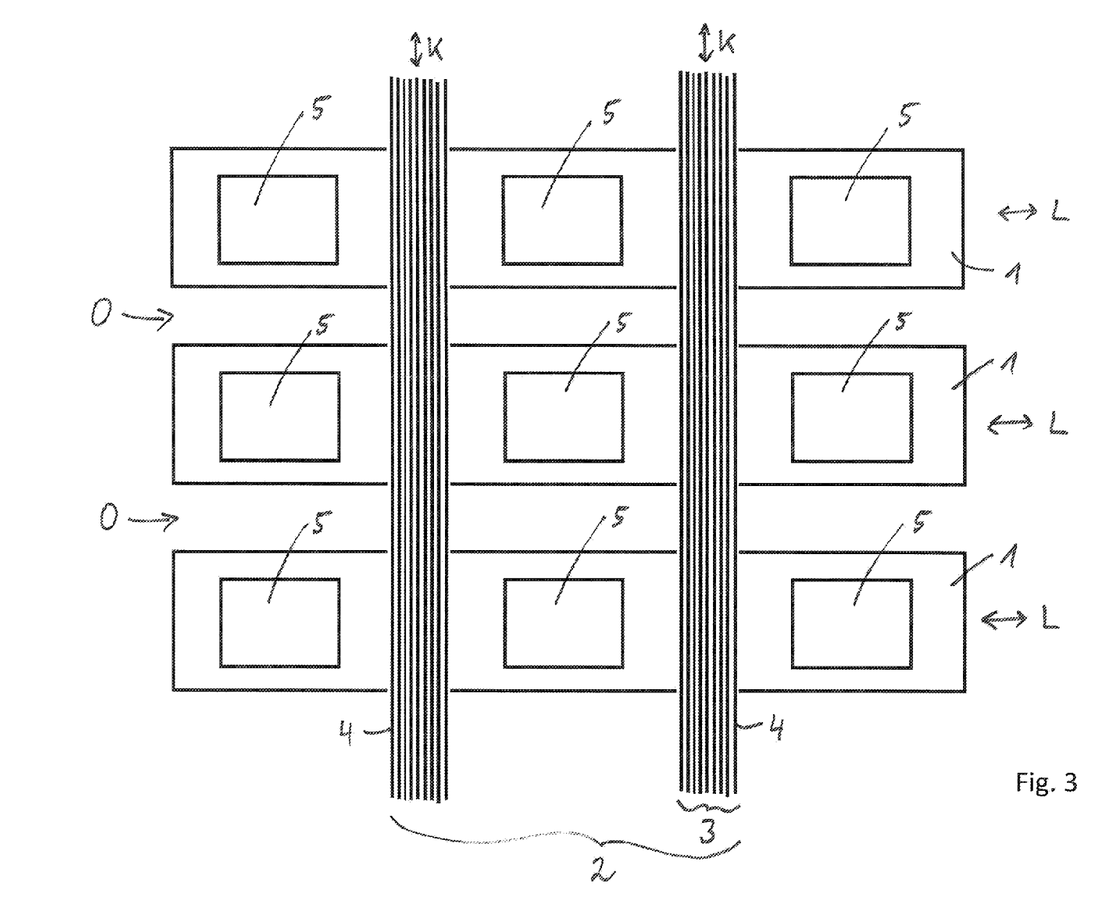
FIG. 3 shows the shading textile in a tensioned state.
Figure 4:
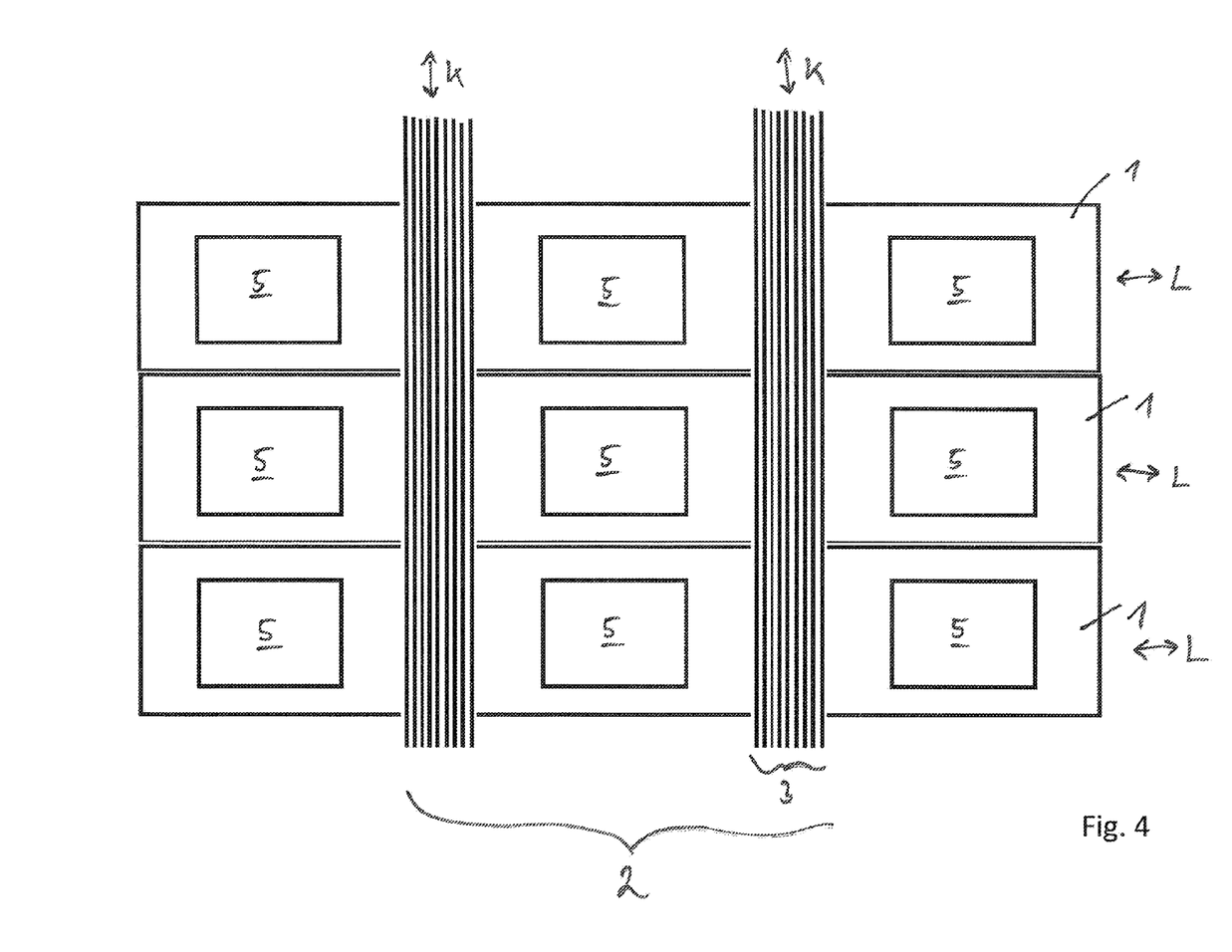
FIG. 4 shows the shading textile when in a non-tensioned or relaxed state.

FIGS. 3 and 4 illustrate the shading textile, that when in a tensioned state, openings (O) between the adjacent photovoltaic lamellas (1) are formed when the shading textile is tensioned. In contrast, the openings (O) are covered up by the photovoltaic lamellas (1) when the shading textile is not tensioned. Thus, FIG. 3 shows the shading textile in a tensioned state, while FIG. 4 shows the textile when it is not tensioned.

Figure 5:
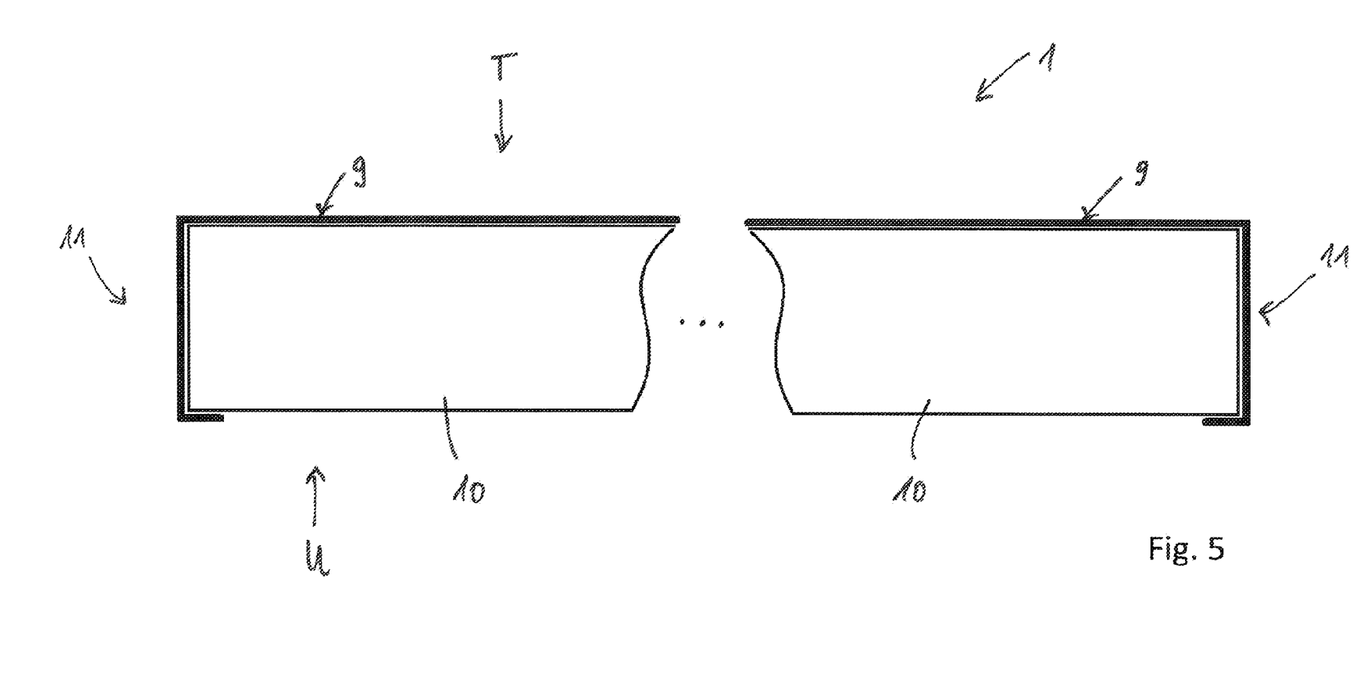
FIG. 5 shows an embodiment in which the photovoltaic film spans a support lamella from a top side, around the edges to the underside of the support lamella.

FIG. 5 shows a shading textile, in which the photovoltaic lamellas (1) each comprise a support lamella (10) to which the at least one photovoltaic film (9) is attached, wherein the photovoltaic film (9) spans the support lamella (10) from a top side (T) of the support lamella around facing longitudinal edges (11) of the support lamella (10) to an underside (U) of the support lamella (10).

Figure 6:
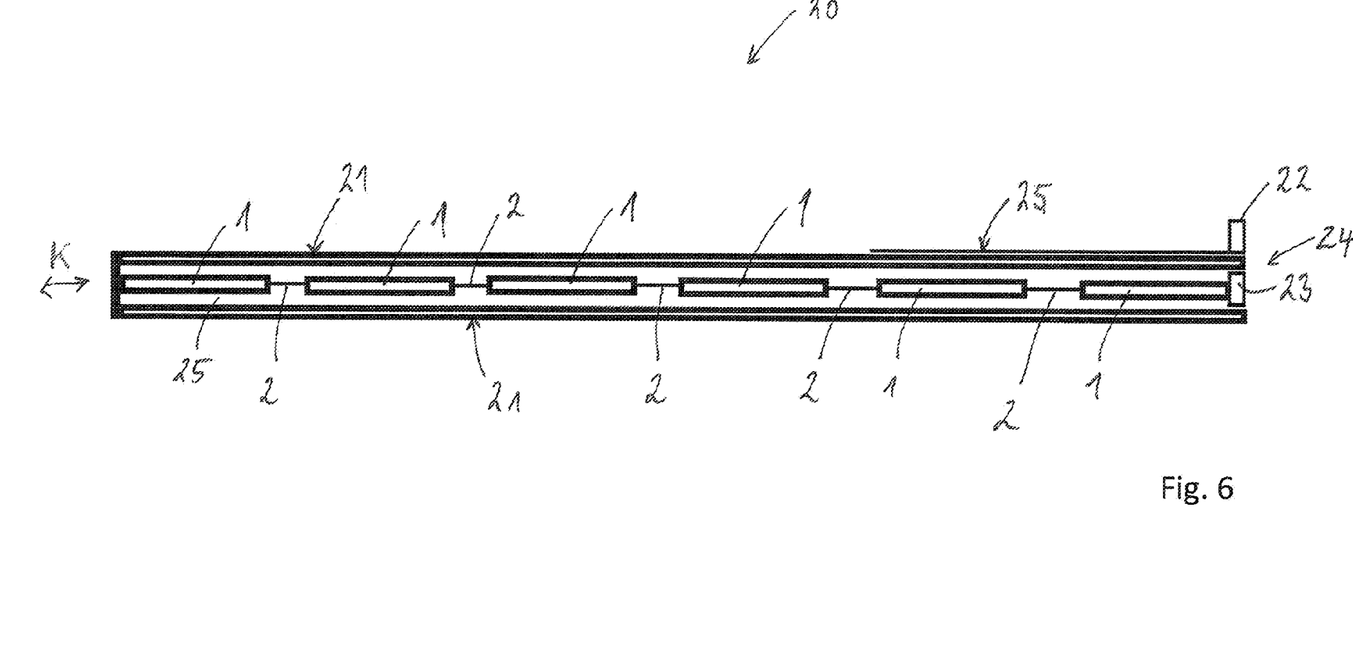
FIG. 6 shows the photovoltaic lamella in a multiple glazing product.

FIG. 6 shows a multiple glazing product (20) comprising a plurality of panes (21) and a plurality of strip-shaped photovoltaic lamellas (1) between the panes, the lamellas (1) being aligned next to one another or spaced apart from one another in their longitudinal direction (L), forming a continuous product by means of a yarn system (2), wherein the yarn system (2) is designed to be elastic in at least one direction (K), so that by tensioning the shading textile, a spacing between adjacent photovoltaic lamellas (1) can be varied perpendicular to the longitudinal direction (L). Further, the shading textile, in the direction (K) in which it is formed elastically, is guided linearly in the interstice between the panes, between a first and a second position, wherein, at a pulling end of the shading textile, a first magnet (23) is arranged, and, outside of the interstice between the panes (21), a second magnet (22) is arranged, wherein the magnets (22, 23) are operatively connected. The second magnet (22) can be moved along a linear guide (25) in the direction (K) in which the shading textile in formed elastically.

The features of the invention disclosed in the above description, in the drawings and in the claims can be essential both individually and also in any combination for the embodiment of the invention.

What is claimed is:
1. A shading textile comprising:
   a plurality of strip-shaped photovoltaic lamellas which, aligned next to one another or spaced apart from one another in their longitudinal direction, form a continuous product by means of a yarn system, wherein the yarn system is designed to be elastic in at least one direction, so that by tensioning the shading textile, a spacing between adjacent photovoltaic lamellas can be varied perpendicular to the longitudinal direction, characterized in that the shading textile, in a tensioned state, comprises openings between the adjacent photovoltaic lamellas which form only when the shading textile is tensioned, or which are covered up by the photovoltaic lamellas; wherein the photovoltaic lamellas each comprise a support lamella to which the at least one photovoltaic film is attached; and wherein the photovoltaic film spans the support lamella from a top side of the support lamella around facing longitudinal edges of the support lamella to an underside of the support lamella.

2. The shading textile according to claim 1 wherein the longitudinal direction in which the photovoltaic lamellas extend is a weft direction of the textile; and wherein the at least one direction in which the yarn system is elastic is a warp direction of the textile.

3. The shading textile according to claim 1, in which the yarn system comprises a plurality of strands, each strand being made of at least one electrically conductive thread that extends in said at least one direction.

4. The shading textile according to claim 3, in which, on at least one of the photovoltaic lamellas, a photovoltaic element is arranged between respective adjacent strands.

5. The shading textile according to claim 1, in which the photovoltaic lamellas comprise at least one film made of an electrically conductive material and extending in said at least one direction, wherein at least one photovoltaic element on the photovoltaic lamella is in electrical contact with the film.

6. The shading textile according to claim 1, in which the photovoltaic lamella comprises a textile web with at least one electrically conductive thread extending in said at least one direction of the shading textile, wherein at least one photovoltaic element on the photovoltaic lamella is in electrical contact with the electrically conductive thread.

7. The shading textile according to claim 1 in which the photovoltaic lamellas comprise elastically deformable photovoltaic films.

8. The shading textile according to claim 1, in which the yarn system can be tensioned elastically in the direction in which the shading textile is formed elastically, and it has a pretensioning in the direction opposite said direction, so that openings that form only when the shading textile is tensioned are closed when the shading textile is not tensioned.

* * * * *